(12) United States Patent
Erdemir et al.

(10) Patent No.: US 10,702,862 B2
(45) Date of Patent: Jul. 7, 2020

(54) SUPERLUBRICIOUS CARBON FILMS DERIVED FROM NATURAL GAS

(71) Applicant: Energy, United States Department of, Washington, DC (US)

(72) Inventors: Ali Erdemir, Naperville, IL (US); Osman Eryilmaz, Plainfield, IL (US); Jair Giovanni Ramirez Gonzalez, San Jose, CA (US)

(73) Assignee: U.S. Department of Energy, Washington, DC (US)

( * ) Notice: Subject to any disclaimer, the term of this patent is extended or adjusted under 35 U.S.C. 154(b) by 264 days.

(21) Appl. No.: 15/952,623

(22) Filed: Apr. 13, 2018

(65) Prior Publication Data

US 2019/0314803 A1    Oct. 17, 2019

(51) Int. Cl.
| | |
|---|---|
| *B01J 37/02* | (2006.01) |
| *B01J 35/00* | (2006.01) |
| *C10M 103/02* | (2006.01) |
| *C23C 28/00* | (2006.01) |
| *C23C 14/06* | (2006.01) |
| *C23C 14/35* | (2006.01) |

(52) U.S. Cl.
CPC ......... *B01J 37/0225* (2013.01); *B01J 35/002* (2013.01); *C10M 103/02* (2013.01); *C23C 14/0605* (2013.01); *C23C 14/35* (2013.01); *C23C 28/343* (2013.01)

(58) Field of Classification Search
CPC .. B01J 37/0225; B01J 35/002; C10M 103/02; C23C 14/0605; C23C 14/35; C23C 28/343; C23C 16/0272; C23C 16/0281
See application file for complete search history.

(56) References Cited

U.S. PATENT DOCUMENTS 7,160,616 B2 *  1/2007  Massler ................. C23C 16/26
                                                            428/408

\* cited by examiner

*Primary Examiner* — Michael P Wieczorek
(74) *Attorney, Agent, or Firm* — Karen L. Blouin; Michael J. Dobbs; Brian J. Lally (57) ABSTRACT

A nanocomposite coating that in turn extract self-replenishing (or -healing), superlubricious carbon film directly from natural gas or hydrocarbon gas in mechanical systems. The coating deposits on sealing and sliding surfaces reducing friction and wear. The result is a reduction in inefficiency, machine breakdown, and adverse environmental impact.

9 Claims, 8 Drawing Sheets
(8 of 8 Drawing Sheet(s) Filed in Color)

SUPERLUBRICIOUS CARBON FILMS DERIVED FROM NATURAL GAS

GOVERNMENT INTERESTS

The United States Government has rights in this invention pursuant to Contract No. DE-AC02-06CH11357 between the U.S. Department of Energy (DOE) and UChicago Argonne, LLC.

FIELD OF THE INVENTION

The present invention relates to a method for extracting self-replenishing superlubricious carbon films from natural gas or hydrocarbon gas.

BACKGROUND OF THE INVENTION

To reduce dependence on imported oil, compact, affordable, highly efficient and durable compressor systems (mountable on walls) are needed for compressing home-line natural gas from nearly 1 atmosphere (14.7 psi) to more than 3500 psi in order to achieve high enough energy density for a reasonable driving range. Natural gas is very abundant in the US and significantly cleaner to burn than other fossil fuels. More favorable residential gas rates (i.e., 50% cheaper than gasoline or diesel) make compressed natural gas (CNG) very attractive. US automakers have so far been very reluctant to make and sell CNG-powered cars due to technological and economic barriers. Of the 12.5 million global natural gas-powered vehicles, only about 120,000 are in the U.S. and most of these vehicles are used for public/school transportation, waste management, and smaller demonstration fleets operated by federal, state, and city governments. Natural gas currently accounts for ≈2% of total energy used for transportation in US.

One of the major technological barriers to overcome is to compress natural gas from home outlets to as much as 5,000 psi and then fill a vehicle's tanks every time quickly and safely for over 10,000 hours of operation. Current compressors with such high capacities are either very expensive and bulky or very difficult to install and operate cost-effectively for home-refueling applications. Existing compressor systems suffer from high-friction, wear, and tear of their sealing and sliding surfaces which rely on low-friction materials (such as Teflon) or coatings (diamond-like carbon films (DLC), $MoS_2$) which fail in the long run and will not survive under the much harsher operating conditions of future compressors.

Therefore, there is an urgent need for a novel, low-cost, high-performance compressor technology suitable for home-refueling applications made possible through the design and development of a catalytically active nanocomposite coating that in turn extract self-replenishing (or -healing), superlubricious carbon film directly from the natural gas or hydrocarbon gas itself and subsequently deposited on sealing and sliding surfaces.

SUMMARY OF THE INVENTION

According to one aspect of the invention, a method of extracting lubricious carbon films from natural gas and other hydrocarbon gases includes coating sliding surfaces in a mechanical system with a catalytically active material. The mechanical system is pressurized to a predetermined pressure and a predetermined temperature is maintained. The mechanical system is filled with a hydrocarbon gas or natural gas which has a composition of approximately 70-90 percent methane, approximately 0-20% ethane, approximately 0-8% carbon, approximately 0-0.2% oxygen, approximately 0-5% nitrogen and approximately 0-5% hydrogen sulphide. When the mechanical system is operated, self-replenishing lubricious carbon films will be extracted.

BRIEF DESCRIPTION OF THE DRAWINGS

The patent or application file contains at least one drawing executed in color. Copies of this patent or patent application publication with color drawing(s) will be provided by the Office upon request and payment of necessary fee. These and further aspects of the invention and their advantages can be discerned in the following detailed description, in which like characters denote like parts and in which.

DETAILED DESCRIPTION OF THE INVENTION

Friction and wear are major causes of energy and material losses in moving mechanical systems and often are the causes for inefficiency, machine breakdown, and adverse environmental impact. Accordingly, great efforts have been devoted to minimizing the adverse impacts of friction and wear by developing effective solid and liquid lubricants. Among the many solid lubricants, carbon-based natural and man-made materials are shown to be rather effective in reducing friction and wear. For example, both graphite and diamond provide very low friction and wear in open air despite one being super-soft while the other is super-hard. Furthermore, recently discovered fullerenes, graphene, nanotubes, nano-onions, and carbon-based coatings such as nanocrystalline diamond, diamond-like carbon, and carbon nitride all combine many of the desirable friction and wear properties of natural diamond and graphite, hence they have sparked tremendous interest both scientifically and industrially in recent years. In particular, graphene, nanotube, and nano-onions were shown to possess some of the lowest friction and wear coefficients when present on contacting surfaces that are in relative motion.

The concept of compressing gaseous media is more than 100 years old and it is used extensively today for all types of mechanical systems such as compressors, pneumatic power tools, refrigerators/air conditioners, turbochargers, heat pumps, in addition to transporting solid, liquid, and gaseous media from one place to another. There are numerous compressor designs available including centrifugal, scroll, diaphragm, reciprocating piston, rotary screw, and vane, etc. In all of these, there exist some components that rub, rotate, or slide against one another. In particular, sealing faces or surfaces are the most critical since they are responsible for achieving and maintaining high pressure differentials. Most current seal materials are made of low-friction polymers (like Teflon, polyethylene, PEEK) and a host of composite or alloyed materials. Fillers and other additives used in these materials improve mechanical, thermal and physical properties which in turn increase resistance to high pressures, temperatures, and corrosive attacks. Low-friction seal coatings like diamond-like carbon (DLC) and $MoS_2$ are used in some compressor systems. For example, some sealing surfaces may be coated with DLC to provide low friction and long wear life in a reciprocating piston natural gas compressor.

Despite such incremental improvements, effective sealing of rotating or reciprocating surfaces of high performance compressors remains as a great challenge especially for long-life and high-pressure compressor applications such as much needed natural gas home-refueling units. DLC and other traditional sealing materials (like Teflon) tend to wear out due to inadequate performance characteristics (especially under high-compression, high speed and high temperature conditions) or limited thickness (i.e., DLC films are typically 1-3 μm thick). For a long-lasting, high-performance, and cost-effective solution a coating that generates its own lubricious carbon film on rubbing or sealing surfaces from the natural gas being compressed is needed.

Diamond-like carbon films (DLC) have an unusual capacity to lower friction and wear when used as an overcoat on a surface. A nearly-frictionless version, i.e., nearly-frictionless carbon (NFC) provides friction and wear coefficients of 0.001-0.01 and $10^{-10}$-$5\times10^{-11}$ $mm^3/N.m$, respectively, to sliding and/or rotating contact surfaces under dry sliding conditions of inert environments. The friction coefficient of Teflon under similar conditions is about 0.05 while those of steels or ceramics would have been more than 0.7. The dramatic reduction of friction by NFC is primarily due to the fact that the surface carbon atoms of these films are fully hydrogen terminated and hence there is little or no adhesive interactions to give rise to friction between the rubbing surfaces.

Figure 1:
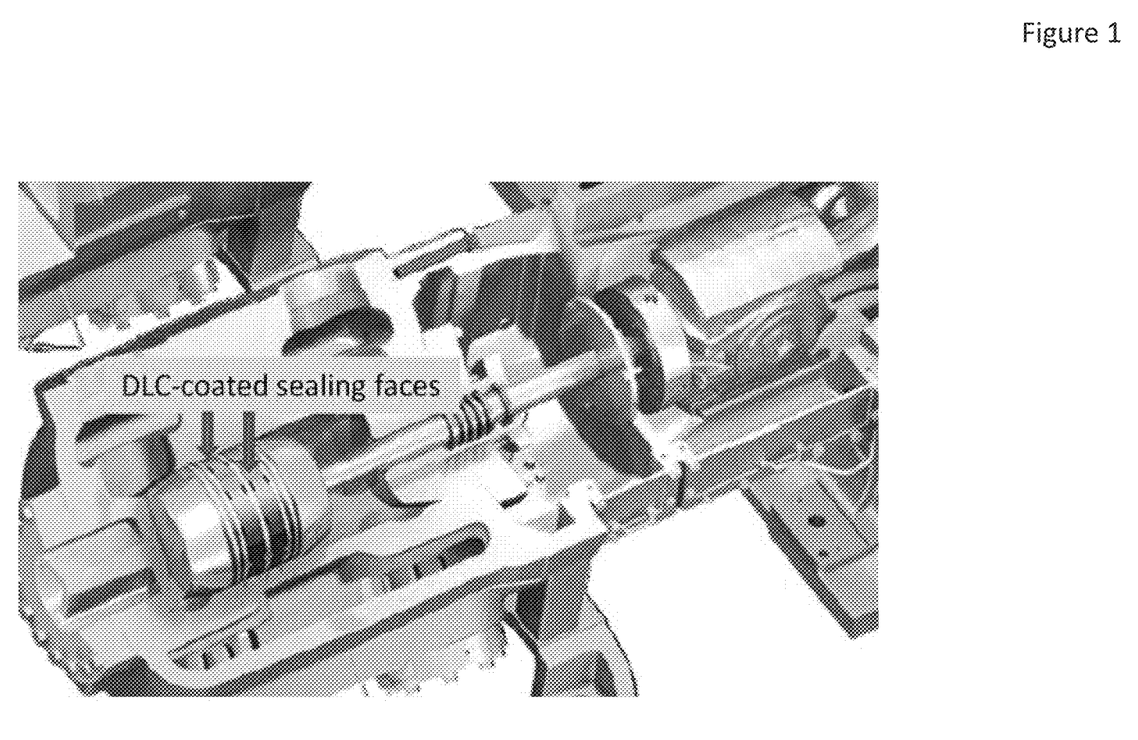
FIG. 1 illustrates DLC-coated sealing surfaces of a reciprocating natural gas compressor.
Figure 2:
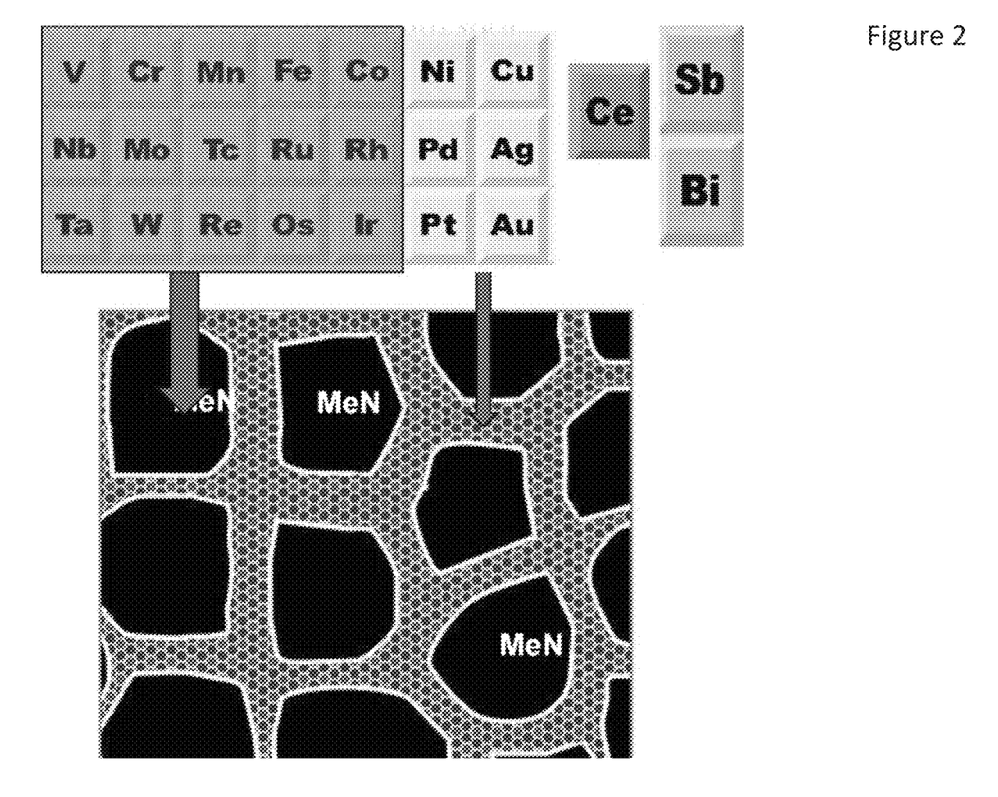
FIG. 2 illustrates one embodiment of a catalytically active nanocomposite coating material according to the invention.

This invention provides a method of extracting carbon nano-structures (lubricious carbon films) from natural gas or hydrocarbon gas. A catalytically active nanocomposite coating can be coated on sliding surfaces of a mechanical system as illustrated in FIG. 1. Sliding surfaces would include pistons, seal packs and fuel injectors. The catalytically active nanocomposite coating is made of a catalytically active hard nitride or carbide phase (more than 95 wt.% of the total coating material) surrounded by a catalytically active soft metallic or alloy phase (up to 5 wt. %). In the embodiment illustrated in FIG. 2, the catalytically active coating consists of a hard nitride (MeN) phase and a softer metallic phase (which are immiscible in MeN and resides mostly at grain boundaries). In alternate embodiments the catalytically active coating may include VN—Ni, VN—Cu, MoN—Ni, MoN—Cu, VN—Co, MoN—Co and combinations thereof. In further embodiments the catalytically active coating may have other compositions that lead to acceptable results.

The sliding surfaces of a mechanical system may be coated with the catalytically active material via sputtering each of the metallic constituents into a nitrogen rich plasma from V, Mo, Nb, W, Ni, Cu, Co targets in a physical deposition system to the predetermined thickness. In one embodiment the predetermined thickness may be approximately 3 nanometer to approximately 50 micrometer. In alternate embodiments the thickness may be a different thickness that produces acceptable results.

A deposition system forming the catalytic coatings on a work pieces generally includes a physical vapor deposition (PVD) apparatus which may be selected from several known processes including cathodic arc PVD, High Power Impulse Magnetron Sputtering (HIPIMS), ion plating, diode or triode Magnetron Sputtering (MS), pulse DC and the hybrids of all mentioned methods. In all of these processes, under the influence of high energy ions, electrons, and neutral atoms a very dense and highly adherent film or coating forms on the surfaces of substrates or work pieces to a desired thickness typically ranging from a few nanometer to up to 10 to 500 micrometers at deposition temperatures of room temperature (approximately 18 degrees Celsius) to approximately 500 degrees Celsius.

Figure 3:
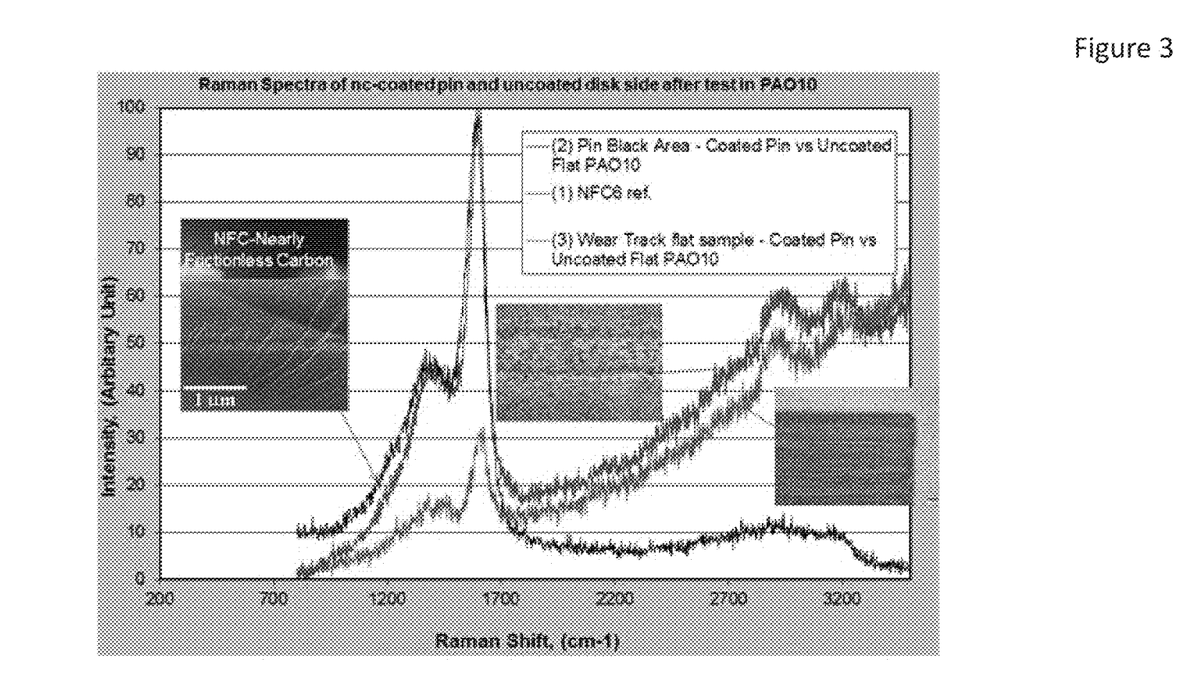
FIG. 3 illustrates a UV-Ramen Spectra of regular NFC and carbon based boundary films extracted by the catalytically active nanocomposite coating from pure poly alpha-olefin (PAO) and deposited on a rubbing pin and flat surfaces.

When a steel pin is rubbed against the catalytically active nano-composite coating in pure paraffinic (base mineral) or poly alpha-olefin (PAO, base synthetic) oils, a highly lubricious and durable carbon film with NFC-like structural chemistry is detected on rubbing surfaces as illustrated in FIG. 3. In tests, the friction coefficient of such surface was less than 0.05, while that of an uncoated pin against uncoated flat in the same base oil was more than 0.12. This in-situ generated carbon film was also very resistant to scuffing (more so than the highly-protective boundary films that typically result from fully formulated engine oils; i.e., scuffing limit of steel against steel in pure PAO: 420N, scuffing limit of steel against steel in fully formulated synthetic Mobil 1 oil: 1100N, scuffing limit of our catalytically active nanocomposite film against steel in pure PAO: 1750N).

After the sliding surfaces are coated, the mechanical system is pressurized to a predetermined pressure. In one embodiment the pressure is approximately 3500 psi. Alternate embodiments may have predetermined pressures between atmospheric pressure (approximately 14.7 psi) to approximately 3500 psi. In yet further embodiments, the predetermined pressure may be greater than approximately 3500 psi. The temperature of the mechanical system is maintained in a predetermined range. The temperature may be maintained by an application specific apparatus or means. In one embodiment the predetermined range is approximately 18° C. to approximately 500° C. Alternate embodiments may have different predetermined temperature ranges such that acceptable results are obtained.

The mechanical system is filled with natural gas or hydrocarbon gas. The natural gas or hydrocarbon gas contains approximately 70-90 percent methane, approximately 0-20 percent ethane, approximately 0-8 percent carbon, approximately 0-0.2 percent oxygen, approximately 0-5 percent nitrogen and approximately 0-5 percent hydrogen sulphide. Under high-pressure compression when the mechanical system is operating, sealing faces of compressors/mechanical systems will be bombarded by the methane, ethane, propane, and butane molecules. In this environment the catalytically active nanocomposite coating will be able to derive similar NFC like boundary films from natural gas or hydrocarbon gas constituents and deposit them as highly durable, superlow friction boundary films on rubbing surfaces. Since lubricious carbon film is derived in-situ and on a self-replenishing/-repairing manner from the natural gas or hydrocarbon gas constituents, there will be no danger of wearing off (as is the case for most PVD or CVD deposited DLC and other low-friction films with finite thickness/life time). Obviously, such catalytically driven carbon films will also reduce frictional losses on seal faces (thus improving efficiency and reducing frictional heat build-up) and at the same time enable very tight sealing and much higher compression ratios through reduced leakage. This will be the ultimate solution for most sliding or reciprocating sealing faces of natural gas or hydrocarbon gas compressors.

To evaluate the coating, using a lab/industrial-scale magnetron sputtering systems in pulsed DC and high power impulse magnetron sputtering modes, MoN—Cu, VN—Cu, NbN—Ni, TaN—Ni nanocomposite coatings were deposited on 440C stainless steel test samples over a range of composition and film thickness. The metallic ingredients (i.e., Mo, V, Cu, Ni, Nb, Ag) of these coatings were selected strategically on the basis of their high catalytic activity toward hydrocarbons. Metal nitride phases in these films (accounting for 95-98 wt. % of total coating mass) provide high hardness for good wear resistance (beside their high catalytic activity), while the softer metals like Ni, Cu, and Ag (which was in the range of 2 to 5 wt. %) further aid in the catalytic cracking of methane in natural gas and help extract methane's carbon as lubricious films on sliding surfaces. All coatings produced exhibited Vickers hardness values of 20 to 35 GPa (depending on softer metal content) and their surface roughness was in the range of 20 to 50 nm. Using the magnetron sputtering system, VN—Cu, MoN—Cu, and NbN—Ni coatings were deposited on steel substrates.

Figure 4A:
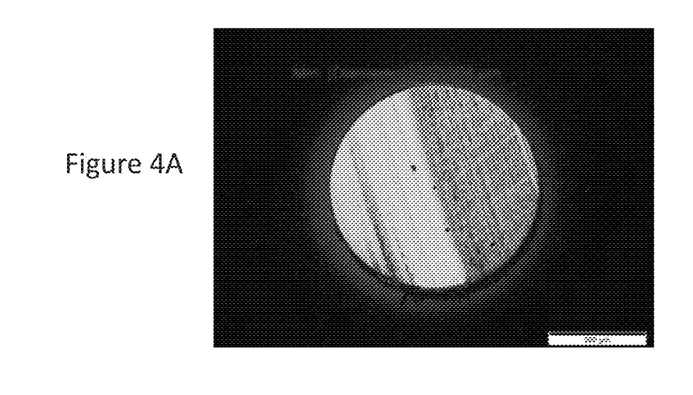
FIG. 4A illustrates a wear scar formed on uncoated 440C steel ball in methane.

Using a sealed vacuum tribometer under 900 torr methane gas pressure, the baseline (uncoated) 440C steel test samples were tested. This test system had a top-mounted ball holder which was pressed against a flat disk-shaped sample below under a contact pressure of about 0.5 GPa. As illustrated in FIG. 4A, the uncoated 440C ball suffered huge wear losses by forming a very large (about 1 mm-diameter) circular wear scar. The sliding disk side was also worn severely and a very deep wear groove had formed. These tests confirmed that bare steel will not function in methane at all; and cannot be used on sliding and sealing surfaces of a natural gas compressor.

Figure 4B:
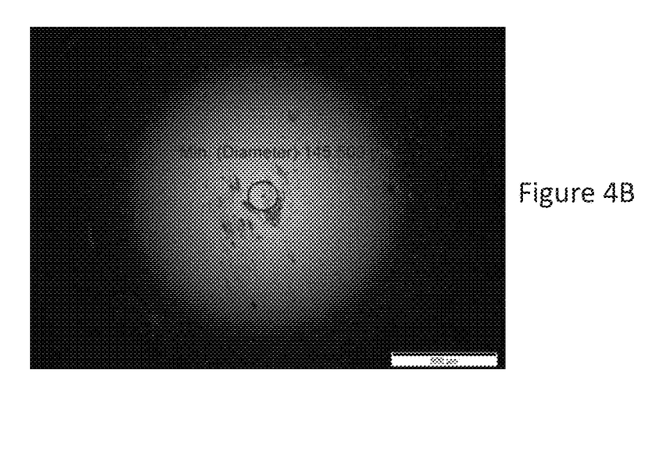
FIG. 4B illustrates a wear scar formed on a VN—Cu coated 440C steel ball in methane.
Figure 4C:
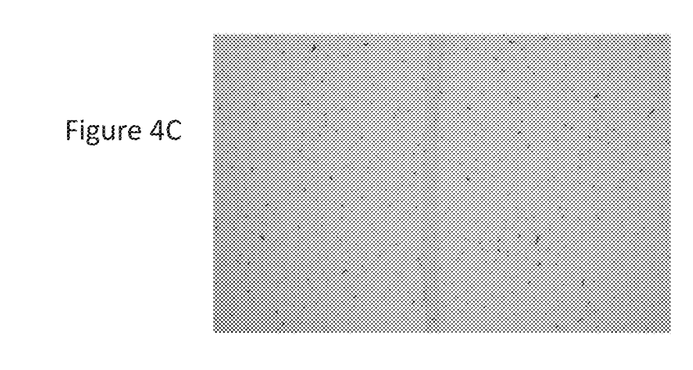
FIG. 4C illustrates a wear track on VN—Cu coated disk.

After establishing baseline performance of uncoated 440C, the friction and wear performance of 440C test samples coated with catalytically active nanocomposite coatings under the same test conditions were evaluated. Specifically, a number of tests with VN—Cu coated ball and disk pairs using the same test system. In this case, the performance was very different: wear damage on the ball side was virtually eliminated as illustrated in FIG. 4B, while on the disk side (See FIG. 4C), it was even far more difficult to discern any wear damage at all. Wear was discernable where sliding or rubbing had occurred but there was no measurable wear on this VN—Cu-coated 440C disk surface.

Figure 5A:
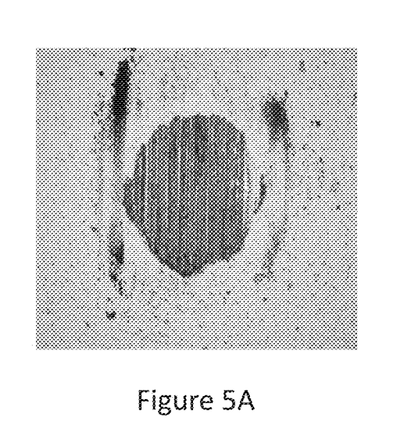
FIG. 5A illustrates a photographic image of a diamond-like carbon film formed on VN—Cu coated ball during a test in methane.
Figure 5B:
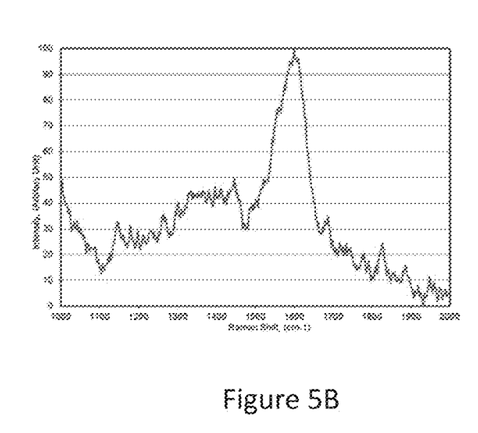
FIG. 5B illustrates a UV-Raman spectrum confirming the formation of a diamond-like carbon film formed on VN—Cu coated ball during a test in methane.

In another test, the contact pressure was lowered to 0.3 GPa and the tests for surface chemical analyses rerun in order to understand the outstanding wear performance of VN—Cu coated test samples. As shown in a high-mag (200×) image in FIG. 5A, the rubbing surface of the VN—Cu-coated ball side was totally covered by a blackish film. The Raman spectrum of such film was similar to that of a diamond-like carbon film. The Raman spectrum illustrated in FIG. 5B suggests that the film is more graphitic in nature and the G band position at around 1590 $cm^{-1}$ supports the formation of graphitic tribofilms on rubbing surfaces. D band intensity at around 1550 $cm^{-1}$ was very small and appeared to be in a shouldered form and not significant.

Figure 6A:
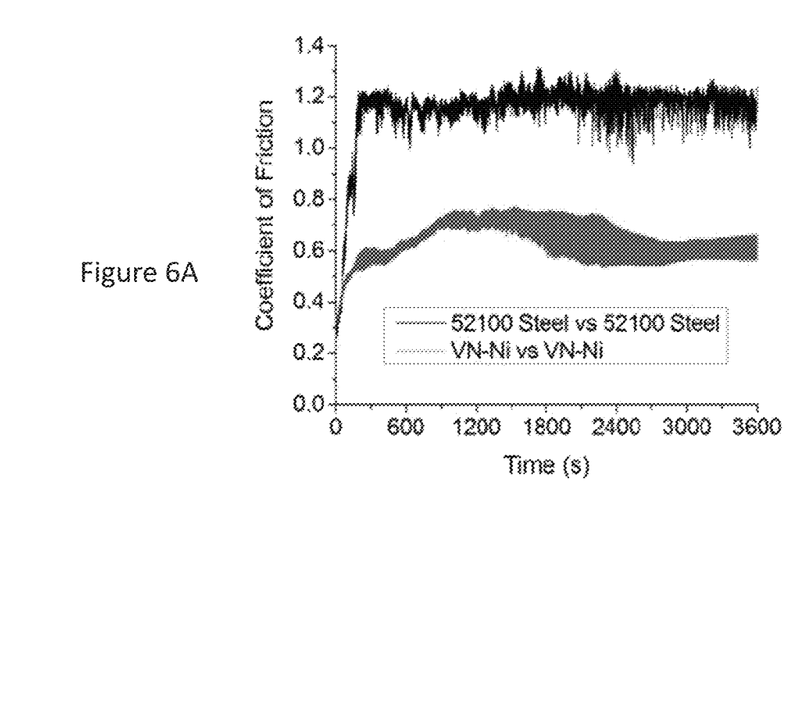
FIG. 6A illustrates a comparison between the friction coefficient of an uncoated AISI 52100 steel ball against a second uncoated AISI 52100 steel ball and the friction coefficient of a VN—Ni coated AISI 52100 steel ball against a second VN—Ni coated AISI 52100 steel ball in 960 bar methane.

In additional tests the following was noted. FIG. 6A compares the friction and wear performance of a control (uncoated AISI 52100 steel test pair) and a VN—Ni coated AISI 52100 steel test pair in atmospheric pressure (960 bar) methane gas. As is apparent from FIG. 6A, the friction coefficient of a steel ball rubbed against the AISI 52100 steel flat goes up very quickly to the level of 1.2 and remains relatively constant (except for an unstable or erratic frictional trace which could be due to high levels of noise caused by extensive stick-slip) until the end of the one hour test. When the same test is repeated with VN—Ni-coated test pair, the friction coefficient is reduced nearly by 50%. More interestingly, as illustrated by comparing FIGS. 6B and 6C, the wear volume for the VN—Ni coated test pair is reduced by more than two orders of magnitude. The wear damage on the uncoated 52100 steel flat was very extensive (See FIG. 6B) as a very wide and deep wear groove had formed; while on the VN—Ni-coated flat side, the wear damage was hard to discern (See FIG. 6C).

Figure 6B:
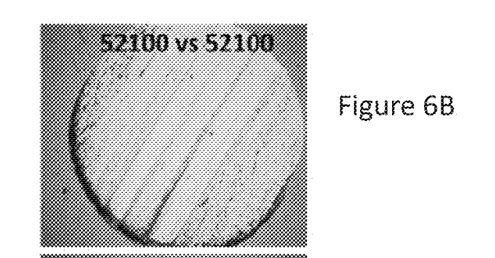
FIG. 6B illustrates a wear scar formed on uncoated AISI 52100 steel ball in methane.
Figure 6C:
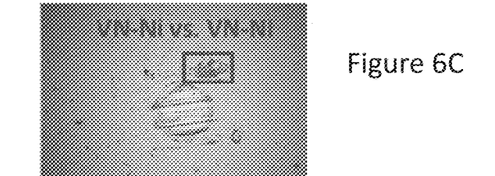
FIG. 6C illustrates a wear scar formed on VN—Ni coated AISI 52100 steel ball in methane.
Figure 7A:
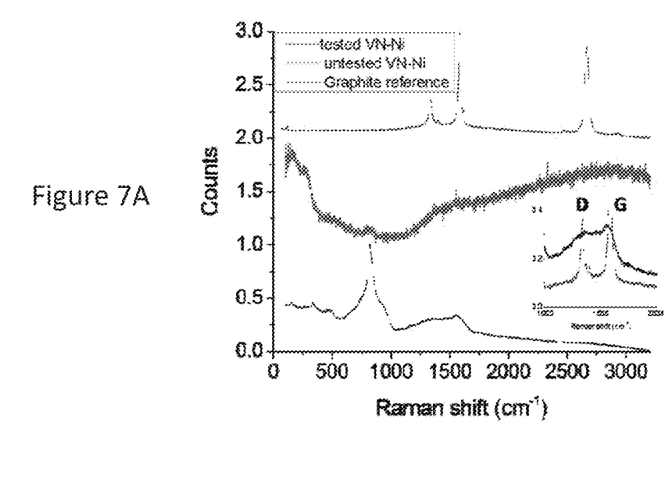
FIG. 7A illustrates a UV-Raman spectrum comparing a coated VN—Ni steel ball, an uncoated steel ball and a graphite reference.

Some blackish wear debris particles or patches accumulated at or near the rubbing surfaces of both the ball and flat surfaces (highlighted with rectangles in FIGS. 6C and 6B). FIG. 7A illustrates a Raman spectroscopy of these deposits. The deposits have a Raman signature that overlaps with the D and G bands of crystalline graphite and a DLC film (which were used as references) suggesting that blackish debris that was detected on and around the rubbing surfaces had structural chemistry similar to these reference materials. Based on the results presented in FIGS. 6A-C and 7A, it was obvious VN—Ni composite coatings provided much lower friction and wear in methane and this was due to a carbon-based tribofilm that was extracted from the methane gas during dynamic sliding.

Figure 7B:
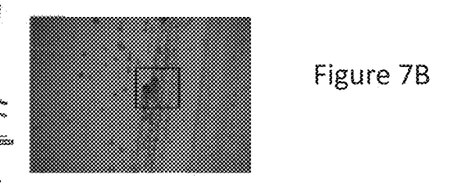
FIG. 7B illustrates a wear track on a VN—Ni coated ball.
Figure 8A:
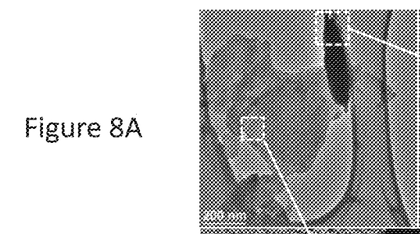
FIG. 8A illustrates a Transmission Electron Microscopy (TEM) study of debris particles at low magnification.
Figure 8B:
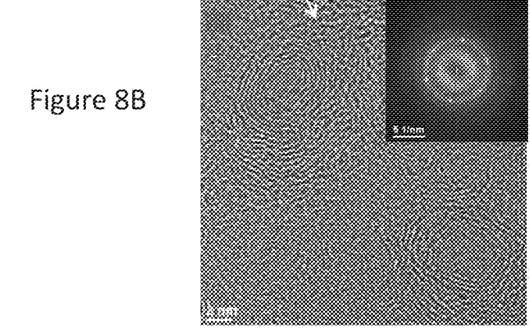
FIG. 8B illustrates a High Resolution Transmission Electron Microscopy (HRTEM) study of debris particles at low magnification.
Figure 8C:
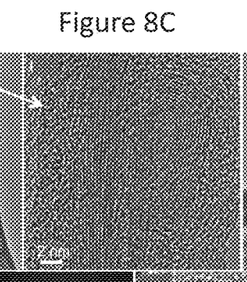
FIG. 8C illustrates a Transmission Electron Microscopy (TEM) image showing carbon nano-onions attached on a graphene sheet.
Figure 8D:
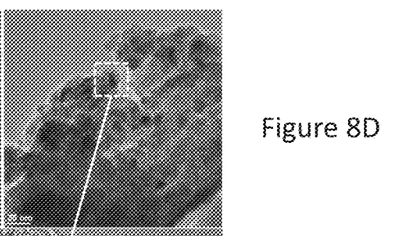
FIG. 8D illustrates a low magnification image of agglomerated nanoparticles wrapped with highly disordered carbon; and, FIG. 8E illustrates a HRTEM image of agglomerated nanoparticles wrapped with highly disordered carbon.
Figure 8E:
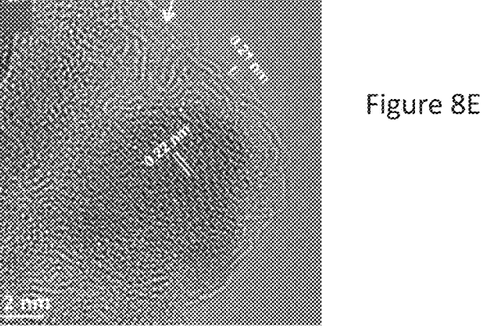

A transmission electron microscopy (TEM) examination of the microstructures and chemical bonding of the debris particles collected from the black region highlighted in by a square in FIG. 7B was performed. Specifically, a portion of the debris particles from this area was recovered using a metallic tip and placed it onto a holey carbon copper grid. The debris was surveyed for appropriate regions that were electron transparent. TEM observations showed that there are two major types of debris: one revealing the existence of graphene, nano-onion (FIGS. 8A-C), another one is an agglomeration of numerous nanoparticles wrapped around by highly disordered graphitic carbon (FIGS. 8D-E). The first type of debris is mainly large graphene sheet ranging from 500 nm to several μm in size as illustrated in FIG. 8A. High-resolution transmission electron microscopy (HR-TEM) showed that these sheets are graphene sheets with layers ranging from single layer (FIG. 8B) to about 10 layers (FIG. 8C). Some carbon nano-onions in diameters of 5 to 10 nm were scattered on graphene sheets as highlighted in FIGS. 8B and 8C throughout the examined area. These carbon nano-onions are hollow in the center and no diamond structure is observed in the center. Compositional analysis using energy-dispersive X-ray spectroscopy (EDS) and electron energy-loss spectroscopy (EELS) further confirmed they are graphene with small amount of Ni and V.

Based on these results, it is clear that VN—Ni coating is able to convert methane into graphene, nano-onion and disordered graphite all of which are known for their favorable anti-friction and -wear properties. Indeed, as was shown in FIG. 7A, friction was reduced by 50% and the wear was reduced by more than two orders of magnitude. Ni in the coating is a well-known catalyst used in the synthesis of graphene, nanotube, and nano-onions by CVD and other methods. Mechanistically, partially filled d-orbitals of Ni and other transition metals enable them to adsorb hydrocarbon molecules which subsequently undergo a dehydrogenation process. Liberated carbon atoms can then migrate throughout the surface (as well as bulk) and eventually come together to form planar sheets of carbon.

In short, lubricious carbon films was extracted from methane gas on rubbing surfaces. This coating can be used on rubbing steel surfaces of compressor systems, methane in natural gas will also act as a source for lubricant (beside being a fuel) and hence those mechanical components operating in such environments will be protected against wear in a continuous and self-healing/replenishing manner.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. § 112, ¶ 6. In particular, the use of "step of" in the claims herein is not intended to invoke the provisions of 35 U.S.C. § 112, ¶ 6.

The invention claimed is:

1. A method of extracting lubricious carbon films from a hydrocarbon gas in a mechanical system comprising the steps of:
   coating sliding surfaces in a mechanical system with a catalytically active material wherein the catalytically active material is selected from the group consisting of VN—Ni, VN—Cu, MoN—Ni, MoN—Cu, VN—Co, MoN—Co and combinations thereof;
   pressurizing the mechanical system to a predetermined pressure;
   maintaining the temperature of the mechanical system in a predetermined range;
   filling the mechanical system with the hydrocarbon gas, the hydrocarbon gas containing approximately 70-90 percent methane, approximately 0-20% ethane, approximately 0-8% carbon, approximately 0-0.2% oxygen, approximately 0-5% nitrogen and approximately 0-5% hydrogen sulphide; and
   operating said mechanical system.

2. The method of claim 1 wherein the step of coating includes using a physical vapor deposition system to form a coating of a predetermined thickness.

3. The method of claim 2 wherein the predetermined thickness is between approximately 3 nanometer to approximately 50 micrometer.

4. The method of claim 2 wherein the physical deposition system includes cathodic arc PVD, High Power Impulse Magnetron Sputtering (HIPIMS), ion plating, diode or triode magnetron sputtering, pulse DC and hybrids of the aforementioned methods.

5. The method of claim 1 wherein the predetermined pressure is approximately 3500 psi.

6. The method of claim 1 wherein the predetermined pressure is greater than approximately 14.7 psi and less than approximately 3500 psi.

7. The method of claim 1 wherein the temperature range is between approximately 18 degrees Celsius to approximately 500 degrees Celsius.

8. A method of extracting lubricious carbon films from a hydrocarbon gas in a mechanical system comprising the steps of:
   coating sliding surfaces in a mechanical system with a catalytically active material;
   pressurizing the mechanical system to a pressure greater 3500 psi;
   maintaining the temperature of the mechanical system in a predetermined range;
   filling the mechanical system with the hydrocarbon gas, the hydrocarbon gas containing approximately 70-90 percent methane, approximately 0-20% ethane, approximately 0-8% carbon, approximately 0-0.2% oxygen, approximately 0-5% nitrogen and approximately 0-5% hydrogen sulphide; and
   operating said mechanical system.

9. A method of extracting lubricious carbon films from a hydrocarbon gas in a mechanical system comprising the steps of:
   coating sliding surfaces in a mechanical system with a catalytically active material;
   pressurizing the mechanical system to a predetermined pressure;
   maintaining the temperature of the mechanical system in a predetermined range;
   filling the mechanical system with the hydrocarbon gas, the hydrocarbon gas containing approximately 70-90 percent methane, approximately 0-20% ethane, approximately 0-8% carbon, approximately 0-0.2% oxygen, approximately 0-5% nitrogen and approximately 0-5% hydrogen sulphide wherein the hydrocarbon gas further includes moisture and sulfur dioxide; and
   operating said mechanical system.

* * * * *